United States Patent [19]

Benko et al.

[11] Patent Number: 4,785,156

[45] Date of Patent: Nov. 15, 1988

[54] SOLDERING METHOD USING LOCALIZED HEAT SOURCE

[75] Inventors: John W. Benko, Trenton; Alexander Coucoulas, Basking Ridge, both of N.J.

[73] Assignee: American Telephone and Telegraph Company, New York, N.Y.

[21] Appl. No.: 135,183

[22] Filed: Dec. 18, 1987

[51] Int. Cl.⁴ ............................................. B23K 26/00
[52] U.S. Cl. ........................... 219/121.64; 219/85 BA; 219/85 BM; 219/121.63
[58] Field of Search .......... 219/85 R, 85 BA, 85 BM, 219/85 D, 85 E, 121 LC, 121 LD, 121 L, 121 LM

[56] References Cited

U.S. PATENT DOCUMENTS 3,283,124  11/1966  Kawecki ................... 219/85 BA X

FOREIGN PATENT DOCUMENTS 0040669  12/1981  European Pat. Off. ....... 219/85 BA

Primary Examiner—C. L. Albritton
Attorney, Agent, or Firm—Roderick B. Anderson

[57] ABSTRACT

In one embodiment (FIG. 1) leads (14) are soldered to bonding pads (11) by heating a silica heating member (17) with a laser beam (16). The heating member has a tubular shape and encloses the solder elements to be heated. In another embodiment (FIG. 3), the heating element is a plate (22) overlying elements to be soldered which plate is scanned by a laser beam (28) along a line (31) in close proximity to the elements to be soldered.

11 Claims, 2 Drawing Sheets

SOLDERING METHOD USING LOCALIZED HEAT SOURCE

TECHNICAL FIELD

This invention relates to processes for bonding conductors to bonding pads of a substrate.

BACKGROUND OF THE INVENTION

Electronic circuit systems are typically made by defining complex integrated circuit structures on semiconductor chips, bonding to chips to circuit package substrates, and in turn bonding the packages to printed circuit boards. The most common bonding technique is wire bonding, in which an instrument (a thermode) thermo-compression bonds wire to a bonding pad of one element, such as a chip, and then pulls the wire and makes a bond on a bonding pad of a second element so as to form an arcuate self-supporting wire bridge the two bonding pads. Other soldering techniques make use of self-supporting leads known as beam leads that extend from the chip. Others use leads that are supported in cantilever fashion by a tape which are applied to chips by a technique known as tape automated (TAB) bonding. With many of these techniques, it is not necessary to apply force to effect a bond; all that is required is the application of heat to melt (reflow) solder between the leads and the bonding pads.

Direct heating of circuit assemblies to reflow solder has been applied, for example, by hot air convention and by an infrared source. One disadvantage of such application is that a relatively large area of the product to be made must be heated to a temperature above the melting point of the solder. Laser beam soldering has been proposed in which the heat is applied by a laser beam directed against leads overlying the solder pads. Differences in reflectivity resulting from variable surface properties may create problems, and also positioning of the beam may be difficult to control. Moreover, it would be desirable, rather than directing a laser at each individual lead, to use a laser to bond a number of leads simultaneously. As the density of circuits increases, along with the increased microminiaturization of integrated circuit chips, there will be an increased need for more expedient soldering processes. Further, in soldering a circuit package to printed circuit board, impingement of the laser beam on the circuit board is likely to damage the circuit board.

The U.S. Pat. No. 4,404,453 of Gotman describes a method for soldering a chip to an alumina ceramic substrate in which a laser beam is directed at the under surface of the substrate to heat it, the heat being transmitted by the substrate to the bonding pads so as to melt the solder between the chip leads and the bonding pads. This has the disadvantage of requiring heating of the substrate to a substantially higher temperature than the melting point of solder, which could damage the substrate, and it is not applicable to printed wiring boards which are typically made of organic materials such as an epoxy-filled mesh.

SUMMARY OF THE INVENTION

This invention is an improvement in a process for bonding together first and second members comprising the steps of directing a laser beam to impinge on a third member so as to heat the third member and using heat from the third member to bond the first and second members. The invention is characterized in that the third member is out of contact with the first and second members and heat is transferred from the third member to the first and second members by radiation. In one embodiment the third member is made of fused silica and is in the shape of a tubular section which substantially encloses the first and second members. Sufficient heat is radiated by the third member into the enclosure to raise the temperature of the first and second members above the melting point of the solder. In another embodiment, the third member is a plate closely overlying a row of leads to be soldered which is impinged by a scanning laser beam. These and other embodiments will be better understood from consideration of the following detailed description taken in conjunction with the accompanying drawing.

DRAWING DESCRIPTION

DETAILED DESCRIPTION

Figure 1:
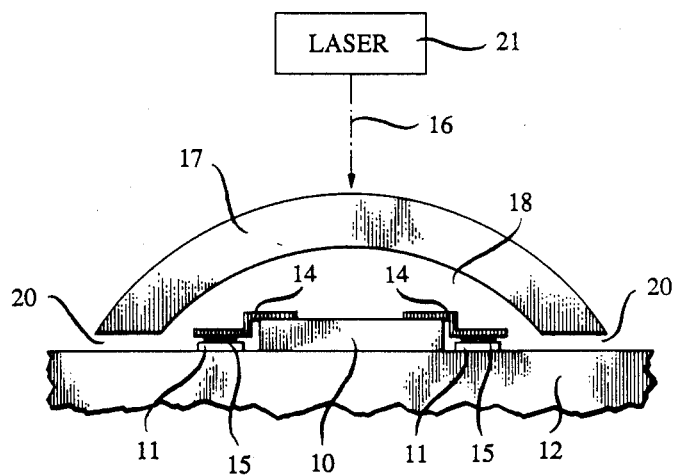
FIG. 1 is a schematic illustration of apparatus for practicing a soldering process in accordance with one embodiment of the invention.

Referring now to FIG. 1, there is shown an element 10, which may be a semiconductor chip, which is to be soldered to bonding pads 11 of a substrate 12, which may be a circuit package substrate. Alternatively, element 10 could be a circuit package and substrate 12 could be a printed circuit board. The element 10 contains electrical leads 14 which have been "tinned," that is, they have been provided with solder elements 15. In accordance with the invention, the solder elements are melted and the leads 14 are soldered to bonding pads 15 by directing the laser beam 16 to impinge on a heating member 17. The heating member 17 is of a material selected to absorb laser beam 16 and convert it to heat without its becoming damaged. The heat in turn is radiated into an enclosure 18 defined by the heating member 17 and the substrate 12 until the temperature of leads 14 are raised sufficiently so as to melt the solder 15. The heating member 17 is preferably separated from substrate 12 by gaps 20 or is otherwise thermally insulated from the substrate 12. For example, insulative pads affixed to the heating member 17 may separate the heating member from the substrate 12.

Experiments have shown that it is quite possible to effect the soldering operation without harmfully heating the substrate 12. For example, the substrate 12 may be a printed circuit board made of a glass mesh filled with epoxy which, when thermally insulated from the heating member 17, will not be damaged even though the enclosure 18 is of sufficiently high temperature to melt solder. Damage to such material can occur even at temperatures on the order of the melting point of solder if maintained for an extended time.

Figure 2:
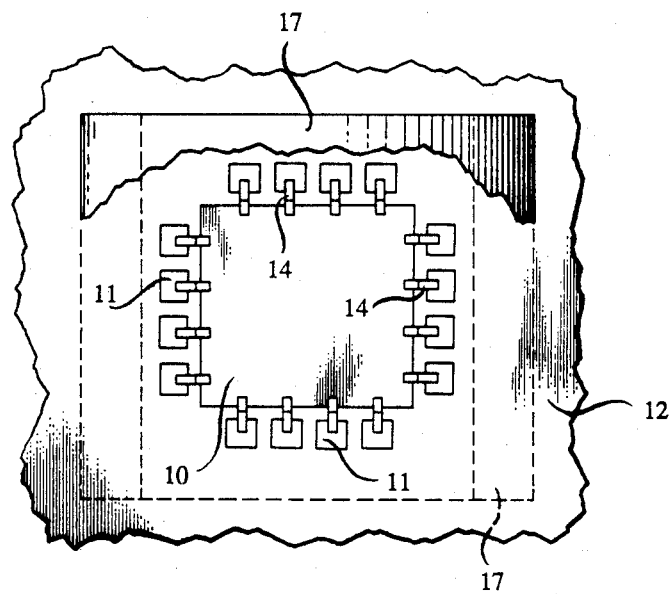
FIG. 2 is a top view of the apparatus of FIG. 1.

As can be appreciated from the plan view of FIG. 2, the heating member 17 is in the shape of a tubular section and is preferably of a material that is fairly refractory and is absorptive of the laser beam being used. We have found that if the laser beam 16 is generated by a carbon dioxide laser 21, the heating element 17 may preferably be of fused silica. The carbon dioxide laser emits coherent light at 10.6 microns and in many cases will produce a visible glow on the portion of the fused silica tube 17 on which it impinges. In one embodiment an unfocused beam was used having an average power of 40 watts, with 2 millisecond pulses at a pulse repetition rate of 150 hertz for a 5-second duration. Microscopic examination of the leads and bonding pads showed that dependable soldering had occurred without heat damage to either the chip or the substrate. Heating times and optimum laser power use would of course vary with the size of the heating member 17; but in any event, sufficient heat should be radiated into the enclosure to melt the solder without doing unnecessary damage to the other elements.

No unique environmental conditions were used in the course of the experiments. It is assumed that elements in the enclosure 18 are heated by radiation from element 17, but they are also heated to some extent by heat convection. As shown in FIG. 2, the ends of the tubular section are open which, along with gaps 20, did presumably permit some air circulation. As can be appreciated from FIG. 2, a large plurality of leads can be simultaneously bonded by reflow soldering in a single operation. In practice, a number of chips to be soldered, each contained by a heating member 17, were arranged on a conveyor belt so as to be driven sequentially beneath the laser 21. This demonstrates that the technique is amenable to automated processing and is effective in increasing efficiency and productivity.

Figure 3:
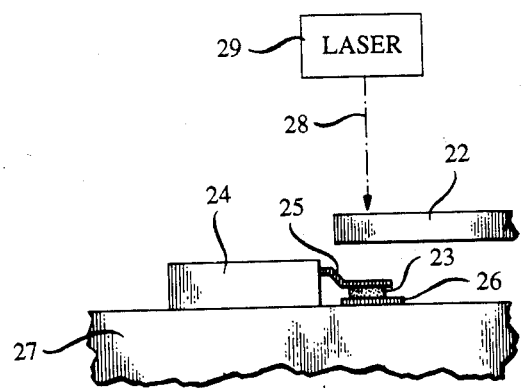
FIG. 3 is a schematic view of apparatus for practicing a soldering process in accordance with another embodiment of the invention.
Figure 4:
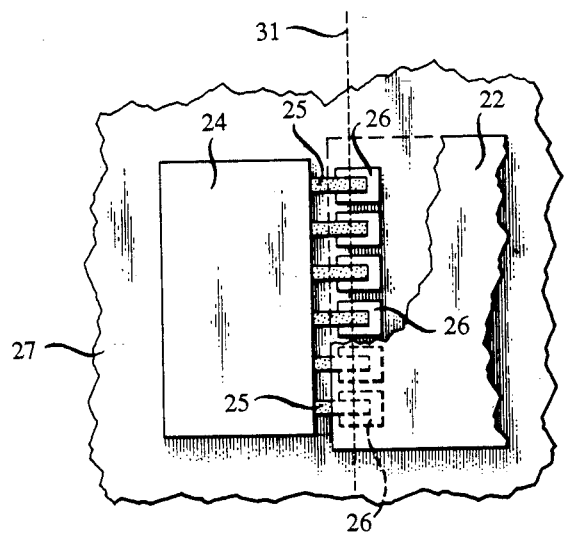
FIG. 4 is a top view of the apparatus of FIG. 3.

There are a number of circuit packages presently under development that could be damaged if subjected to the full high temperature required for reflow soldering. Referring to FIG. 3, further localization of the applied heat is attained by configuring the heating member as a plate 22 which overlies a solder element 23 to be melted. In the FIG. 3 embodiment, element 24 may be a circuit package containing, for example, a resin encapsulant which could be damaged by high temperatures. It is desired to solder leads 25 to solder pads 26 of a substrate 27. A laser beam 28 from a laser 29 scans heating member 22 along a line 31 overlying the solder elements 23 as shown in FIG. 4. The scanning of the beam 28 along the line 31 creates heat in the member 22 that is localized along line 31; thus, heat from the line is radiated downwardly so as to melt the solder elements which are in close proximity to it. There is a temperature gradient in other directions so that the temperature to which circuit package 24 is subjected is significantly smaller than that to which the solder is subjected. Further, there is no need to step the laser beam from one contact area to another; rather, the scan line 31 may be continuous and therefore fairly easy to control with relatively simple apparatus. Experiment shows that, with apparatus of this type, the heat applied to substrate 27 is insufficient to damage a printed circuit board made of glass filled with epoxy. On the other hand, if the laser scanned the leads 25 directly, it would also impinge on the substrate 27; and experiment has shown that the direct impingement on the printed circuit board would tend to damage it. It can be appreciated that the FIG. 3 embodiment, like the FIG. 2 embodiment, is quite amenable to mass production techniques.

Numerous other embodiments and modifications of the invention will be apparent to those skilled in the art without departing from the spirit and scope of the invention.

What is claimed is:

1. A process for bonding together first and second members comprising the steps of directing a laser beam to impinge on a third member so as to heat the third member and using heat from the third member to bond the first and second members characterized in that the third member is out of contact with the first and second members and heat is transferred from the third member to the first and second members by radiation.

2. The process of claim 1 further characterized in that the bonding comprises the step of reflow soldering the first and second members.

3. The process of claim 2 further characterized in that the first member is one of a plurality of electrical leads; the second member is one of a plurality of bonding pads; and the third member radiates heat so as to solder a plurality of leads to a plurality of bonding pads simultaneously.

4. The process of claim 3 further characterized in that the third member is made of fused silica.

5. The process of claim 4 further characterized in that the third member is in the shape of tubular section which substantially encloses the leads and bonding pads to be soldered.

6. The process of claim 4 further characterized in that the contact areas of the plurality of leads and bonding pads lie along a substantially straight line; the third member is in close proximity to the straight line; and the laser beam scans the third member along a line parallel to the straight line.

7. A proces for soldering together first and second members comprising the steps of directing a laser beam to impinge on a third member so as to heat the third member and using heat from the third member to melt solder for joining the first and second members characterized in that the third member is in the shape of a tubular section; the third member is out of contact with the first and second members and it substantially encloses the first and second members; and sufficient heat is radiated by the third member into the enclosure defined by the third member to raise the temperature of the first and second members above the melting point of solder.

8. The process of claim 7 further characterized in that the third member is made of fused silica; and the laser beam is generated by a carbond dioxide laser.

9. The process of claim 8 further characterized in that the first, second and third members are supported by a substrate which, with the third member defines the enclosure containing the first and second members; and the third member is substantially thermally insulated from the substrate.

10. A process for soldering a plurality of electrical leads to a plurality of bonding pads arranged in a row characterized in that a third member is arranged parallel to the row of bonding pads and out of contact with the leads and bonding pads; a laser beam is directed so as to scan the third member in a direction along a line parallel to the row of bonding pads; and wherein the third member is a material which absorbs the laser beam to convert it to sufficient heat which is radiated toward the leads so as to solder the leads to the bonding pads.

11. The process of claim 10 further characterized in that the third member is of fused silica and the laser beam is generated by a carbon dioxide laser.

* * * * *

UNITED STATES PATENT AND TRADEMARK OFFICE
CERTIFICATE OF CORRECTION

PATENT NO. : 4,785,156
DATED : November 15, 1988
INVENTOR(S) : John W. Benko and Alexander Coucoulas It is certified that error appears in the above—identified patent and that said Letters Patent is hereby corrected as shown below:

Column 4, Line 31, "proces" should be --process--.

Column 4, Line 46, "carbond" should be --carbon--.

Signed and Sealed this

Twenty-fifth Day of April, 1989

Attest:

DONALD J. QUIGG

*Attesting Officer*　　　*Commissioner of Patents and Trademarks*